(12) United States Patent
Katayama et al.

(10) Patent No.: US 9,356,572 B2
(45) Date of Patent: May 31, 2016

(54) SOUND PROCESSING APPARATUS, SOUND SYSTEM AND SOUND PROCESSING METHOD

(71) Applicant: YAMAHA CORPORATION, Hamamatsu-shi, Shizuoka (JP)

(72) Inventors: Masaki Katayama, Hamamatsu (JP); Ryotaro Aoki, Hamamatsu (JP)

(73) Assignee: Yamaha Corporation, Hamamatsu-shi (JP)

( * ) Notice: Subject to any disclaimer, the term of this patent is extended or adjusted under 35 U.S.C. 154(b) by 492 days.

(21) Appl. No.: 13/720,139

(22) Filed: Dec. 19, 2012

(65) Prior Publication Data

US 2013/0156228 A1 Jun. 20, 2013

(30) Foreign Application Priority Data

Dec. 20, 2011 (JP) .................................. 2011-278375

(51) Int. Cl.
*H03G 3/00* (2006.01)
*H03G 3/20* (2006.01)
(Continued)

(52) U.S. Cl.
CPC ................. *H03G 3/20* (2013.01); *H03G 3/348* (2013.01); *H04R 5/04* (2013.01); *H04S 7/30* (2013.01)

(58) Field of Classification Search
CPC .. H04R 3/12; H04R 2430/20; H04R 2499/13; H04R 5/04; H04R 1/323; H04R 1/403; H04R 2205/041; H04R 25/70; H04R 1/26; H04R 1/347; H04R 2201/021; H04R 27/00; H04R 29/00; H04R 29/001; H04R 3/04; H04R 1/24; H04S 7/302; H04S 2400/15; H04S 5/00; H04S 2420/11; H04S 7/30; H04S 1/002; H04S 5/02; G10H 1/0033; G10H 1/16; G10H 1/0041; G10K 15/08; G10K 11/1788; G10K 11/175; H03G 3/001; H03G 3/04; H03G 9/02; H04H 60/04; H04N 11/00
USPC ......... 381/107, 104, 17, 77, 109, 119, 18, 56, 381/58, 59, 60, 61, 71.1, 71.7, 73.1, 98, 381/102, 111, 118, 182, 300, 306, 312, 381/71.6, 80, 82, 89, 97
See application file for complete search history.

(56) References Cited

U.S. PATENT DOCUMENTS

| 5,422,602 A | 6/1995 | Werrbach |
| 2001/0022841 A1 | 9/2001 | Motojima et al. |

(Continued)

FOREIGN PATENT DOCUMENTS

| CN | 1694579 A | 11/2005 |
| CN | 1926910 A | 3/2007 |

(Continued)

OTHER PUBLICATIONS

Chinese Office Action and Search Report dated Feb. 2, 2015 with English-language translation (fourteen (14) pages).

(Continued)

*Primary Examiner* — Akelaw Teshale
(74) *Attorney, Agent, or Firm* — Crowell & Moring LLP

(57) ABSTRACT

A sound processing apparatus processes a first sound signal and a second sound signal. The sound processing apparatus includes a first adjustor which adjusts a volume of the first sound signal, a second adjustor which adjusts a volume of the second sound signal, and a control unit which causes the first adjustor and the second adjustor to adjust the first sound signal gradually changed over a first gradually-change time and the second sound signal gradually changed over a second gradually-change time, wherein the second gradually-change time is shorter than and included in the first gradually-change time.

11 Claims, 7 Drawing Sheets

(51) Int. Cl.
*H03G 3/34* (2006.01)
*H04R 5/04* (2006.01)
*H04S 7/00* (2006.01)

(56) References Cited

U.S. PATENT DOCUMENTS

| | | | |
|---|---|---|---|
| 2002/0141604 A1* | 10/2002 | Abe | H04S 7/00 381/104 |
| 2005/0249364 A1 | 11/2005 | Makino et al. | |
| 2008/0025520 A1 | 1/2008 | Sakai et al. | |
| 2008/0130918 A1* | 6/2008 | Kimijima | H04S 1/007 381/107 |
| 2009/0022337 A1 | 1/2009 | Sakai et al. | |
| 2009/0034748 A1 | 2/2009 | Sibbald | |
| 2009/0214056 A1 | 8/2009 | Takahata | |
| 2010/0054483 A1* | 3/2010 | Mizuno | H04S 7/302 381/17 |
| 2012/0170772 A1* | 7/2012 | Zheng | G11B 20/10527 381/107 |

FOREIGN PATENT DOCUMENTS

| | | |
|---|---|---|
| CN | 1937738 A | 3/2007 |
| CN | 101350602 A | 1/2009 |
| CN | 102098606 A | 6/2011 |
| EP | 1 758 428 A1 | 2/2007 |
| JP | 2008-109560 A | 5/2008 |

OTHER PUBLICATIONS

European Office Action dated Aug. 10, 2015 (eight (8) pages).
Extended European Search Report dated Jan. 20, 2015 (eight (8) pages).

* cited by examiner

SOUND PROCESSING APPARATUS, SOUND SYSTEM AND SOUND PROCESSING METHOD

BACKGROUND

1. Technical Field

The present invention relates to a technique for processing a sound signal.

2. Background Art

In order to prevent noise due to change in an operation mode of a sound system, a configuration in which reproduced sound is temporarily attenuated through silence processing (mute processing) and the operation mode is changed within a silence period is generally made. Meanwhile, when a sound signal is instantaneously changed to a silence state, instantaneous noise (hereinafter, referred to as "pop noise") is likely to occur. For the purpose of preventing pop noise, for example, JP-A-2008-109560 discloses a technique (soft mute processing) in which the volume of the sound signal changes over a predetermined time (hereinafter, referred to as "gradually-change time") in a stepwise manner.

SUMMARY

A surround system in which a plurality of speakers are disposed around a listener is heretofore proposed. The surround system includes, for example, a subwoofer having a reproduction band of mainly a low-tone range, and a front speaker having a reproduction band which exceeds the reproduction band of the subwoofer. However, if a common gradually-change time during silence processing is applied to the subwoofer and the front speaker, the following problem may occur.

FIGS. 6 and 7 are schematic views of the temporal waveforms (signals after silence processing on sine waves) of a sound signal YW to be supplied to the subwoofer and a sound signal YF to be supplied to the front speaker. The time T2 of FIG. 6 means the gradually-change time necessary for preventing pop noise of the sound signal YF, and the time T1 of FIG. 7 means the gradually-change time necessary for preventing pop noise of the sound signal YW. The gradually-change time necessary for preventing pop noise changes depending on the frequency of the sound signal. Since the frequency of the sound signal YW illustrated in FIGS. 6 and 7 falls below the frequency of the sound signal YF, the time T1 is longer than the time T2.

As shown in FIG. 6, when the gradually-change time T2 corresponding to the sound signal YF is commonly applied to the silence processing of both of the sound signal YW and the sound signal YF, the volume of the sound signal YW of the subwoofer steeply changes, and pop noise may occur in reproduced sound. Meanwhile, as shown in FIG. 7, when the gradually-change time T1 corresponding to the sound signal YW is commonly applied to the silence processing of both of the sound signal YW and the sound signal YF, it is possible to prevent pop noise for both the subwoofer and the front speaker; however, the volume of the sound signal YF unnecessarily changes over a long time. As described above, since the gradually-change time necessary for preventing pop noise of the sound signal YF is the time T2, when the gradually-change time T1 corresponding to the sound signal YW is used, the gradually-change time is required extra by the time (T1-T2), causing a problem in that sound output is delayed.

Although in the above description, the sound system including the subwoofer and the front speaker is illustrated, in an arbitrary configuration in which a plurality of speakers with different reproduction bands reproduce audio, the same problem may occur. Taking into consideration the above situation, an object of the invention is to prevent failure (for example, sound cutoff) due to an extremely long gradually-change time while effectively preventing the occurrence of pop noise in reproduced sound of a plurality of speakers with different reproduction bands.

An aspect of the invention provides a sound processing apparatus which processes a first sound signal and a second sound signal, the sound processing apparatus including: a first adjustor which adjusts a volume of the first sound signal; a second adjustor which adjusts a volume of the second sound signal; and a control unit which causes the first adjustor and the second adjustor to adjust the first sound signal gradually changed over a first gradually-change time and the second sound signal gradually changed over a second gradually-change time, wherein the second gradually-change time is shorter than and included in the first gradually-change time.

In the above configuration, the first sound signal to be supplied to the first speaker with a low reproduction band is gradually changed over the first gradually-change time longer than the second gradually-change time. Accordingly, it is possible to prevent pop noise due to steep change in the first sound signal compared to a configuration in which both the first sound signal and the second sound signal are gradually changed over the second gradually-change time. The second sound signal to be supplied to the second speaker with a reproduction band beyond the first speaker is gradually changed over the second gradually-change time shorter than the first gradually-change time. Therefore, it is possible to avoid failure, such as sound cutoff, in reproduced sound of the second sound signal.

The first sound signal may be, for example, a sound signal which is supplied to the first speaker (for example, a subwoofer), in which the lower limit value of the reproduction band is the first frequency. The second sound signal may be, for example, a sound signal which is supplied to the second speaker, in which the lower limit value of the reproduction band is the second frequency beyond the first frequency. Although in the above description, only the first sound signal and the second sound signal are described for convenience, the invention can be applied similarly to a configuration in which sound signals of three or more channels are processed. That is, a configuration in which the above-described requirements are satisfied when one sound signal selected from the sound signals of the three or more channels is set as the first sound signal and other sound signals are set as the second sound signal of course falls within the scope of the invention regardless of the total number of channels.

The control unit may control the first adjustor and the second adjustor to cause gradually-change the first sound signal and gradually-change the second sound signal to start or end at a common point in time. In the above aspect, it is advantageous that the gradually-change the first sound signal and the second sound signal can be controlled using a common control signal which instructs the start of gradually changing.

The sound processing apparatus may be configured so that the first gradually-change time is set to a time equal to or longer than the time of half wavelength of a waveform corresponding to a first frequency included in the first sound signal, and the second gradually-change time is set to a time equal to or longer than the time of half wavelength of a waveform corresponding to a second frequency included in the second sound signal. According to the above configuration, it is possible to effectively prevent the occurrence of pop noise in both of the first sound signal and the second sound signal. Since pop noise in reproduced sound of a subwoofer assigned to a low-tone range is particularly significantly perceived, the invention is especially suitable for a configuration that the first speaker to which the first sound signal is supplied is a subwoofer.

The sound processing apparatus may be configured so that the control unit has a capability of performing fade-out on the first sound signal and the second sound signal before a silence period starts and fade-in on the first sound signal and the second sound signal when the silence period elapses, and the control unit causes the first adjustor and the second adjustor to adjust, for either or both of the fade-out or the fade-in, the first sound signal gradually changed over the first gradually-change time and the second sound signal gradually changed over the second gradually-change time. The selection of whether the gradually-change the first sound signal over the first gradually-change time and the gradually-change the second sound signal over the second gradually-change time are applied to one of fade-out before the start of the silence period and fade-in when the silence period has elapsed (alternatively, one of fade-out and fade-in) or both of fade-out and fade-in is appropriately made in accordance with the purpose or performance of the sound processing apparatus.

The invention can be conceived as a sound system using a sound processing apparatus according to the foregoing aspects. A sound system includes a first speaker in which a lower limit value of a reproduction band is set to be a first frequency; a second speaker in which a lower limit value of a reproduction band is set to be a second frequency beyond the first frequency; and a sound processing apparatus which generates a first sound signal to be supplied to the first speaker and a second sound signal to be supplied to the second speaker. The sound processing apparatus includes a first adjustor which adjusts a volume of the first sound signal, a second adjustor which adjusts a volume of the second sound signal, and a control unit which causes the first adjustor and the second adjustor to adjust the first sound signal gradually changed over a first gradually-change time and the second sound signal gradually changed over a second gradually-change time, wherein the second gradually-change time is shorter than and included in the first gradually-change time. According to this configuration, the same functions and effects as the sound processing apparatus of the invention are realized.

DETAILED DESCRIPTION

First Embodiment

Figure 1:
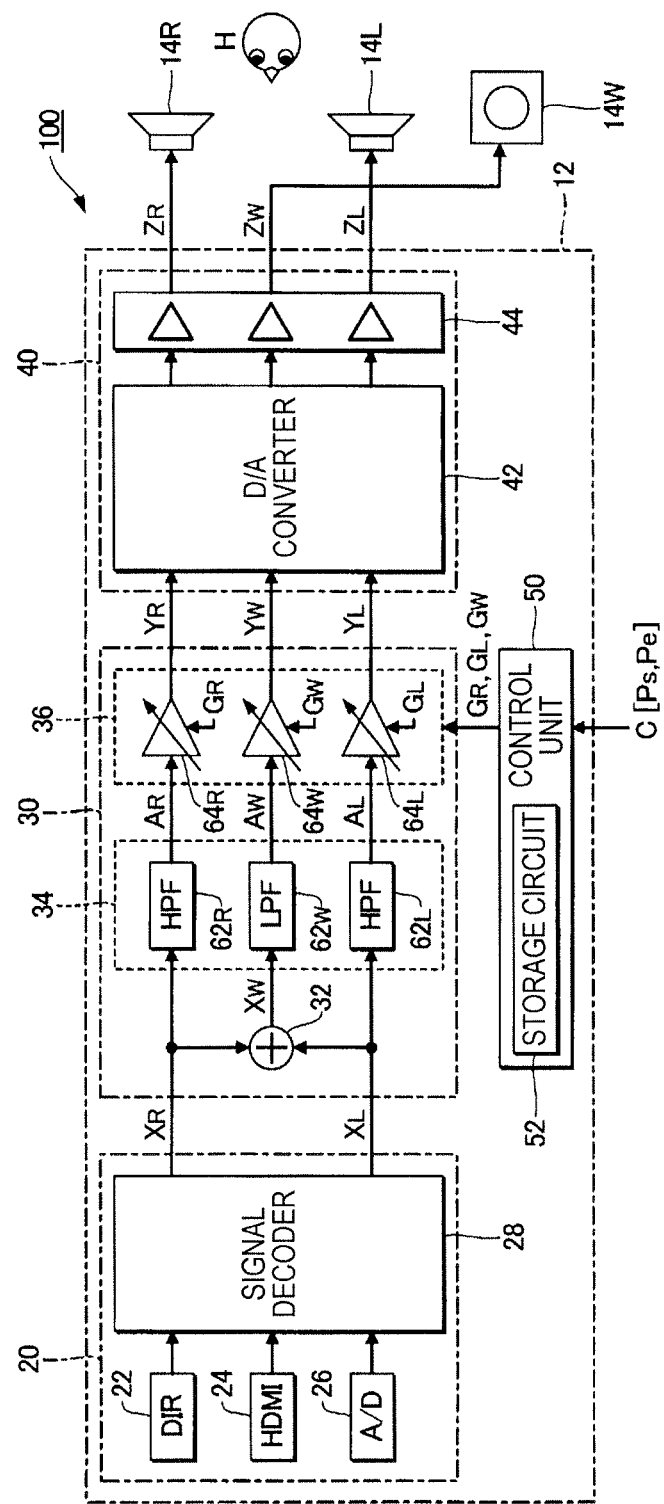
FIG. 1 is a block diagram of a sound system according to an aspect of the invention.

FIG. 1 is a block diagram of a sound system 100 according to a first embodiment of the invention. The sound system 100 is a surround system which provides a realistic sound field, and includes a sound processing apparatus 12 and three speakers 14 (14R, 14L, 14W). The three speakers 14 have a right-channel front speaker 14R, a left-channel front speaker 14L, and a subwoofer 14W. The front speaker 14R is disposed on the right front side of a listener H, and the front speaker 14L is disposed on the left front side of the listener H. The subwoofer 14W is disposed at an arbitrary position (typically, at the front side of the listener M. When it is not necessary to distinguish between the right channel and the left channel, in the following description, a symbol R which means the right channel and a symbol L which means the left channel are marked with a symbol F in an overall manner (F=R, L). For example, the front speaker 14F means each of the front speaker 14L and the front speaker 14R.

The sound processing apparatus 12 is a signal processing apparatus which generates sound signals Z (ZR, ZL, ZW) of three channels and supplies the sound signals Z to the speakers 14. The sound signal ZR is supplied to the front speaker 14R, the sound signal ZL is supplied to the front speaker 14L, and the sound signal ZW is supplied to the subwoofer 14W. Each speaker 14 reproduces a sound wave according to the sound signal Z supplied from the sound processing apparatus 12.

The subwoofer 14W and the front speakers 14F have different reproduction bands (rated frequency range). Specifically, the reproduction band of the subwoofer 14W is a low-tone range in which a first frequency F1 is set as a lower limit value, and the reproduction bands of the front speakers 14F are a middle-tone range and a high-tone range in which a second frequency F2 (F2>F1) beyond the first frequency F1 is set as a lower limit value. For example, the reproduction band of the subwoofer 14W is from 20 Hz (=F1) to 100 Hz, and the reproduction band of each front speaker 14F is from 100 Hz (=F2) to 20 kHz.

As shown in FIG. 1, the sound processing apparatus 12 includes a signal input unit 20, a signal processing unit 30, a signal output unit 40, and a control unit 50. The signal input unit 20 supplies a sound signal XR of the right channel and a sound signal XL of the left channel to the signal processing unit 30. Specifically, the signal input unit 20 includes a DIR (Digital audio Interface Receiver) 22 and an HDMI (High-Definition Multimedia Interface/Registered Trademark) 24 which receive a digital signal from an external device, such as a video reproduction device or a broadcasting receiver, an A/D converter 26 which converts an analog signal supplied from the external device to a digital signal, and a signal decoder 28 which generates digital sound signal XR and sound signal XL through decoding processing on the digital signal supplied from each front-stage component.

The signal processing unit 30 is an electronic circuit (DSP: Digital Signal Processor) which generates sound signals Y (YR, YL, YW) of three channels from the sound signal XR and the sound signal XL supplied from the signal input unit 20. The signal output unit 40 includes a D/A converter 42 which converts the sound signals Y generated by the signal processing unit 30 from digital to analog, and an amplification circuit 44 which amplifies the outputs of the D/A converter 42 to generate the sound signals Z (ZR, ZL, ZW). The sound signals Z generated by the signal output unit 40 are supplied to the speakers 14 and reproduced as a sound wave. The control unit 50 is, for example, an arithmetic processing circuit (such as CPU: Central Processing Unit) which executes a program stored in a storage circuit 52 to control the respective components of the sound processing apparatus 12 in an overall manner.

The specific configuration of the signal processing unit 30 will be described. As shown in FIG. 1, the signal processing unit 30 includes a signal adder 32, a band selector 34, and a silence processing unit 36. The signal adder 32 adds the sound signal XR and the sound signal XL supplied from the signal input unit 20 to generate a sound signal XW.

The band selector 34 is a component which selects the band of the sound signal X (XR, XL, XW) of each channel, and includes a filter 62R, a filter 62L, and a filter 62W. The filter 62R selectively passes a band component of the sound signal XR corresponding to the reproduction band of the front speaker 14R as a sound signal AR. Similarly, the filter 62L passes a band component of the sound signal XL corresponding to the reproduction band of the front speaker 14L as a sound signal AL. For example, a high-pass filter (HPF) which passes a band beyond 100 Hz is used as the filter 62R and the filter 62L. The filter 62W selectively passes a band component of the sound signal XW generated by the signal adder 32 corresponding to the reproduction band of the subwoofer 14W as a sound signal AW. For example, a low-pass filter (LPF) which passes a band below 100 Hz may be used as the filter 62W.

The silence processing unit 36 of FIG. 1 adjusts the volume of the sound signals A (AR, AL, AW) generated by the band selector 34 to generate the sound signals Y (YR, YL, YW) of the three channels. Specifically, the silence processing unit 36 can perform silence processing for temporarily attenuating (silencing) the volume of the sound signals A. The silence processing unit 36 includes three adjustors 64 (64R, 64L, 64W) corresponding to the channels. The adjustors 64 are multipliers which multiply the sound signals A by adjustment values G (GR, GL, GW). The adjustor 64R multiplies the sound signal AR by the adjustment value GR to generate the sound signal YR, the adjustor 64L multiplies the sound signal AL by the adjustment value GL to generate the sound signal YL, and the adjustor 64W multiplies the sound signal AW by the adjustment value GW to generate the sound signal YW. Each adjustment value G is variably set within a range between a predetermined value g0 and a predetermined value g1. The predetermined value g0 is a numerical value (g0=0) which silences (mutes) the sound signal A, and the predetermined value g1 is a numerical value (g1=1) which passes the sound signal A as it is.

The control unit 50 of FIG. 1 variably controls the adjustment values G (GR, GL, GW) which are applied to the adjustors 64 of the silence processing unit 36. The control of the adjustment values G by the control unit 50 is executed sequentially, for example, in a predetermined cycle. Schematically, each adjustment value G is maintained at the predetermined value g1 in the normal state, and when silence processing is instructed, is temporarily set to the predetermined value g0.

Figure 2:
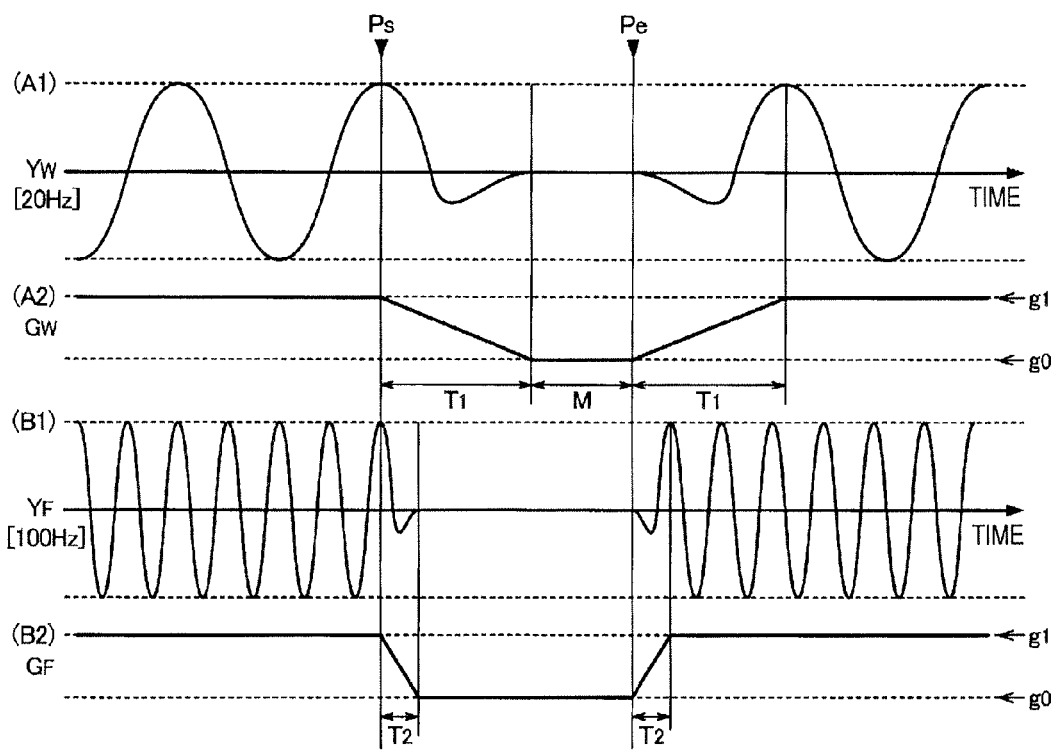
FIG. 2 is an explanatory view of silence processing in a sound processing apparatus according to a first embodiment.

As shown in FIG. 1, a control signal C which instructs to execute the silence processing is supplied from the external device to the control unit 50. As shown in FIG. 2, the control signal C designates a reference point Ps of the start of silence processing and a reference point Pe of the end of silence processing. Specifically, the control signal C designates the reference point Ps before the change time of an operation mode and the reference point Pe after the change time such that reproduced sound is silenced during a silence period M including a period necessary for changing the operation mode of the sound processing apparatus 12. For example, the reference point Ps and the reference point Pe are designated before and after the operation of the sound processing apparatus 12 is changed from stereo reproduction to monaural reproduction or the format of a signal supplied from the external device to the signal input unit 20 is changed (the format of decoding processing by the signal decoder 28 is changed).

FIG. 2 is an explanatory view of silence processing. A portion (A1) of FIG. 2 is the temporal waveform of the sound signal YW (ZW) when silence processing is executed with the sine wave of the first frequency F1 (F1=20 Hz) corresponding to the lower limit value of the reproduction band of the subwoofer 14W as the sound signal AW. A portion (B1) of FIG. 2 is the temporal waveform of the sound signal YF (ZF) when silence processing is executed with the sine wave of the second frequency F2 (F2=100 Hz) corresponding to the lower limit value of the reproduction band of the front speaker 14F as the sound signal AF. A portion (A2) of FIG. 2 is a temporal change in the adjustment value GW which is applied to the adjustor 64W, and a portion (B2) of FIG. 2 is a temporal change in the adjustment value GF (GL, GR) which is applied to the adjustor 64F.

As shown in the portion (A2) of FIG. 2, the control unit 50 controls the adjustment value GW such that the adjustment value GW decreases (fades out) from the predetermined value g1 to the predetermined value g0 with time over a predetermined time (hereinafter, referred to as "first gradually-change time") T1 from the reference point Ps designated with the control signal C. Accordingly, as shown in the portion (A1) of FIG. 2, the volume of the sound signal YW decreases with time over the first gradually-change time T1 from the reference point Ps and reaches zero (silence state) at the start point of the silence period M. As shown in the portion (B2) of FIG. 2, the control unit 50 controls the adjustment value GF such that the adjustment value GF decreases (fades out) from the predetermined value g1 to the predetermined value g0 with time over a predetermined time (hereinafter, referred to as "second gradually-change time") T2 from the reference point Ps designated with the control signal C. Accordingly, as shown in the portion (B1) of FIG. 2, the volume of the sound signal YF decreases over the second gradually-change time T2 from the reference point Ps with time and reaches zero.

As will be understood from FIG. 2, the first gradually-change time T1 of the adjustment value GW is longer than the second gradually-change time T2 of the adjustment value GF. Specifically, the higher the frequency (F1, F2) as the lower limit value of the reproduction band of each speaker 14, the shorter the gradually-change time of each adjustment value G is set. For example, as expressed by Numerical Expression (1), the first gradually-change time T1 is set to the time length equal to or greater than the time of half of one cycle of the waveform corresponding to the first frequency F1 as the lower limit value of the reproduction band of the subwoofer 14W. As expressed by Numerical Expression (2), the second gradually-change time T2 is set to the time length equal to or greater than the time of half of one cycle of the waveform corresponding to the second frequency F2 as the lower limit value of the reproduction band of the front speaker 14F. For example, when the first frequency F1 is 20 Hz, and the second frequency F2 is 100 Hz, the first gradually-change time T1 is set to be equal to or longer than 25 milliseconds, and the second gradually-change time T2 is set to be equal to or longer than 5 milliseconds.

$$T1 \geq 1/(F1 \times 2) \quad (1)$$

$$T2 \geq 1/(F2 \times 2) \quad (2)$$

The control unit 50 changes (fades in) the adjustment value GW from the predetermined value g0 to the predetermined value g1 with time over the first gradually-change time T1 from the reference point Pe designated with the control signal C, and changes (fades in) the adjustment value GF from the predetermined value g0 to the predetermined value g1 with time over the second gradually-change time T2 (T2<T1) from the reference point Pe. Accordingly, the volume of the sound signal YW increases over the first gradually-change time T1 from the reference point Pe with time and reaches the same volume as the sound signal AW, and the volume of the sound signal YF increases over the second gradually-change time T2 from the reference point Pe with time and reaches the same volume as the sound signal AF.

Figure 6:
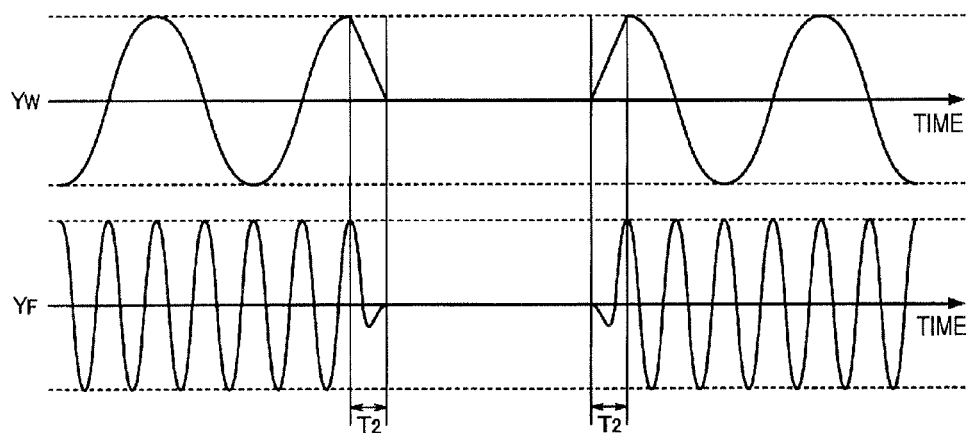
FIG. 6 is an explanatory view illustrating a problem when a common gradually-change time of silence processing is applied to a plurality of speakers with different reproduction bands.

As described above, the sound signal YW corresponding to the subwoofer 14W is gradually changed (i.e., faded out/faded in) over the first gradually-change time T1 longer than the second gradually-change time T2. Accordingly, it is possible to prevent pop noise due to steep change in the sound signal YW compared to a configuration in which both of the sound signal YW and the sound signal YF are gradually changed over the second gradually-change time T2 (FIG. 6).

Figure 7:
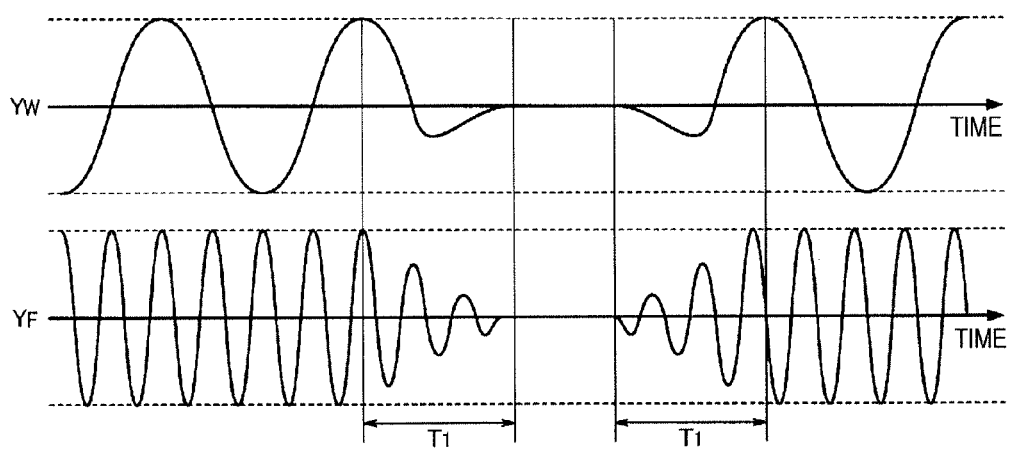
FIG. 7 is an explanatory view illustrating a problem when a common gradually-change time of silence processing is applied to a plurality of speakers with different reproduction bands.

The sound signal YF corresponding to each front speaker 14F is gradually changed over the second gradually-change time T2 shorter than the first gradually-change time T1. Accordingly, it is possible to prevent failure (for example, sound cutoff immediately after the reference point Pe) due to variation in the sound signal YF over a long time compared to a configuration in which both of the sound signal YW and the sound signal YF are gradually changed over the first gradually-change time T1 (FIG. 7). That is, it is possible to effectively prevent pop noise in reproduced sound of the low-tone speaker 14 (subwoofer 14W), and to reduce the time necessary until reproduced sound of the high-tone speaker 14 (front speaker 14F) is transited from the silence state to the normal reproduction state (it is possible to prevent failure, such as missing of the head portion of reproduced sound).

In the first embodiment, the first gradually-change time T1 is set to the time equal to or longer than half wavelength of the waveform corresponding to the first frequency F1, and the second gradually-change time T2 is set to the time equal to or longer than half wavelength of the waveform corresponding to the second frequency F2. For this reason, it is possible to reliably prevent pop noise in reproduced sound of both the subwoofer 14W and each front speaker 14F.

Second Embodiment

A second embodiment of the invention will be described below. In each embodiment or modification described below, the actions or functions are the same as those in the first embodiment, and a certain component is represented by the reference numeral in the description of the first embodiment, and detailed description will be appropriately omitted.

Figure 3:
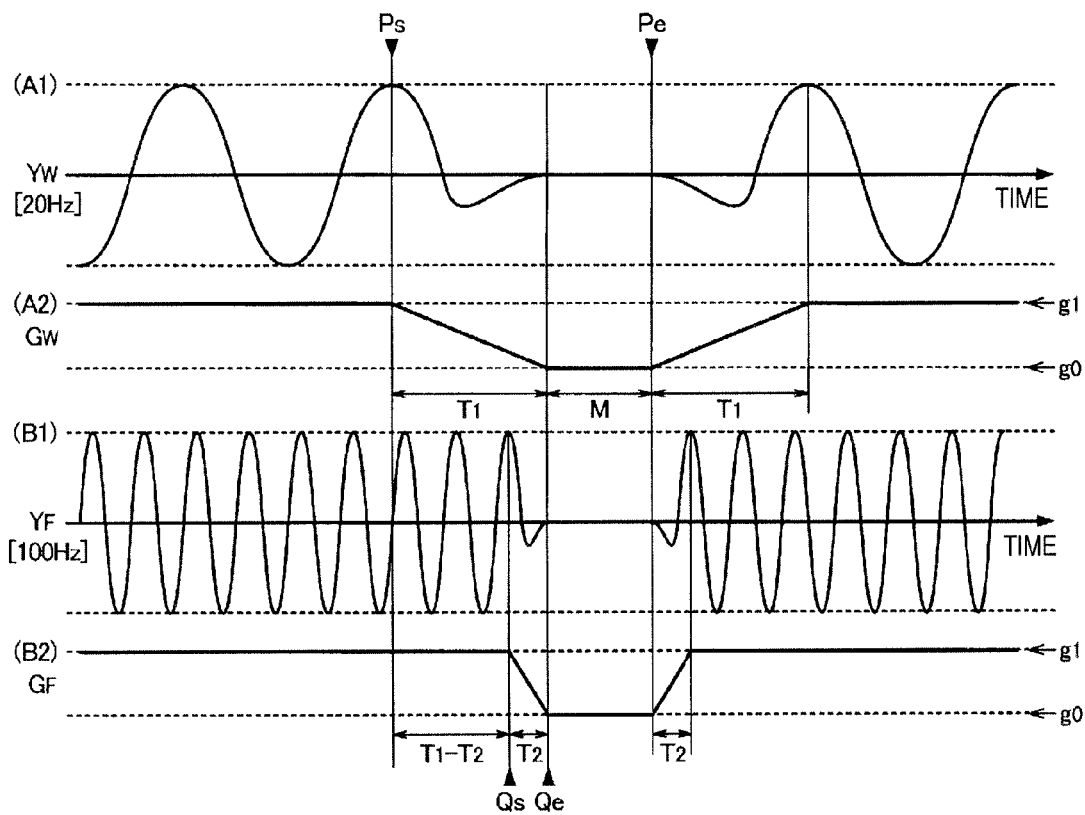
FIG. 3 is an explanatory view of silence processing in a sound processing apparatus according to a second embodiment.

FIG. 3 is an explanatory view of silence processing in the second embodiment. As in FIG. 2, the waveforms of the sound signal YW (portion (A1)) and the sound signal YF (portion (B1)) and the temporal changes in the adjustment value GW (portion (A2)) and the adjustment value GF (portion (B2)) are shown in FIG. 3.

In the first embodiment, a case where the fade-out of the sound signal YW and the fade-out of the sound signal YF start from the common reference point Ps has been described. In the second embodiment, as shown in FIG. 3, the adjustment value GW and the adjustment value GF are controlled such that the fade-out of the sound signal YW and the fade-out of the sound signal YF end at a common point of time Qe.

Specifically, as in the first embodiment, the control unit 50 controls the adjustment value GW such that the adjustment value GW decreases over the first gradually-change time T1 from the reference point Ps and reaches the predetermined value g0 at the point of time Qe (the start point of the silence period M). As shown in FIG. 3, the control unit 50 controls the adjustment value GF so as to decrease from the predetermined value g1 over the second gradually-change time T2 from the point of time Qs delayed by the time difference (T1-T2) between the first gradually-change time T1 and the second gradually-change time T2 with respect to the reference point Ps and reaches the predetermined value g0 at the point of time Qe.

In the second embodiment, the similar effects to in the first embodiment are realized. In the second embodiment, the time length until the sound signal YF is in the silence state from when the fade-out of the sound signal YW and the fade-out of the sound signal YF end at the common point of time Qe is reduced by the time difference (T1-T2) between the first gradually-change time T1 and the second gradually-change time T2 compared to the first embodiment. That is, in the second embodiment, it is possible to maintain the sound signal YF in the reproduction state immediately before the silence period M. Although the above description focuses on the fade-out of the sound signal YW and the sound signal YF, the fade-in of the sound signal YW and the fade-in of the sound signal YF may end at the common point of time.

<Modifications>

The foregoing embodiments may be modified in various ways. Specific modifications will be described below.

Two or more modifications arbitrarily selected from the following illustration may be appropriately combined.

(1) Although the above description focuses on the combination of the subwoofer 14W and the front speaker 14F, the same configuration may be applied to an arbitrary combination of a plurality of speakers with different reproduction bands. For example, in a configuration in which the reproduction band of a rear speaker disposed at the back of the listener H is different from the reproduction band of the front speaker, similarly to each embodiment described above, the invention is applied to the combination of the front speaker and the rear speaker. However, pop noise is noise in a high-tone range in which the frequency is significantly different from reproduced sound of the subwoofer 14W, and reproduced sound of the subwoofer 14W is often set to loud volume (accordingly, pop noise has loud volume). For this reason, pop noise which occurs in reproduced sound of the subwoofer 14W tends to be remarkably easily perceived by the listener compared to pop noise which occurs in reproduced sound of another speaker, such as the front speaker 14F. Therefore, the invention which can prevent pop noise in reproduced sound is especially effective for a configuration in which the subwoofer 14W with a low reproduction band is used.

Similarly to each embodiment described above, the invention is applied to a combination of three or more speakers. For example, a sound system 100 in which the first speaker in which the lower limit value of the reproduction band is the first frequency F1, the second speaker in which the lower limit value of the reproduction band is the second frequency F2 beyond the first frequency F1, and a third speaker in which the lower limit value of the reproduction band is a third frequency F3 beyond the second frequency F2 are used is assumed (F1<F2<F3). In the above configuration, the first sound signal supplied to the first speaker is gradually changed over the first gradually-change time T1, the second sound signal supplied to the second speaker is gradually changed over the second gradually-change time T2 shorter than the first gradually-change time T1, and a third sound signal supplied to the third speaker is gradually changed over a third gradually-change time T3 shorter than the second gradually-change time T2 (T1>T2>T3).

(2) Although in each embodiment described above, the adjustment value GW changes over the first gradually-change time T1 at the time of the start of silence processing (immediately after the reference point Ps) and the end of silence processing (immediately after the reference point Pe), the first gradually-change time T1 for which the adjustment value GW decreases at the time of the start of silence processing and the first gradually-change time T1 for which the adjustment value GW increases at the time of the end of silence processing may be set to be different in the time length. The same applies to the second gradually-change time T2 of the adjustment value GF. Although in each embodiment described above, the adjustment value GW and the adjustment value GF change linearly, the adjustment value GW and the adjustment value GF may change in a curved manner (nonlinearly).

(3) Although in each embodiment described above, the adjustment value GW and the adjustment value GF have the common variation range (g0 to g1), the variation range of the adjustment value GW and the variation range of the adjustment value GF may be different.

Figure 4:
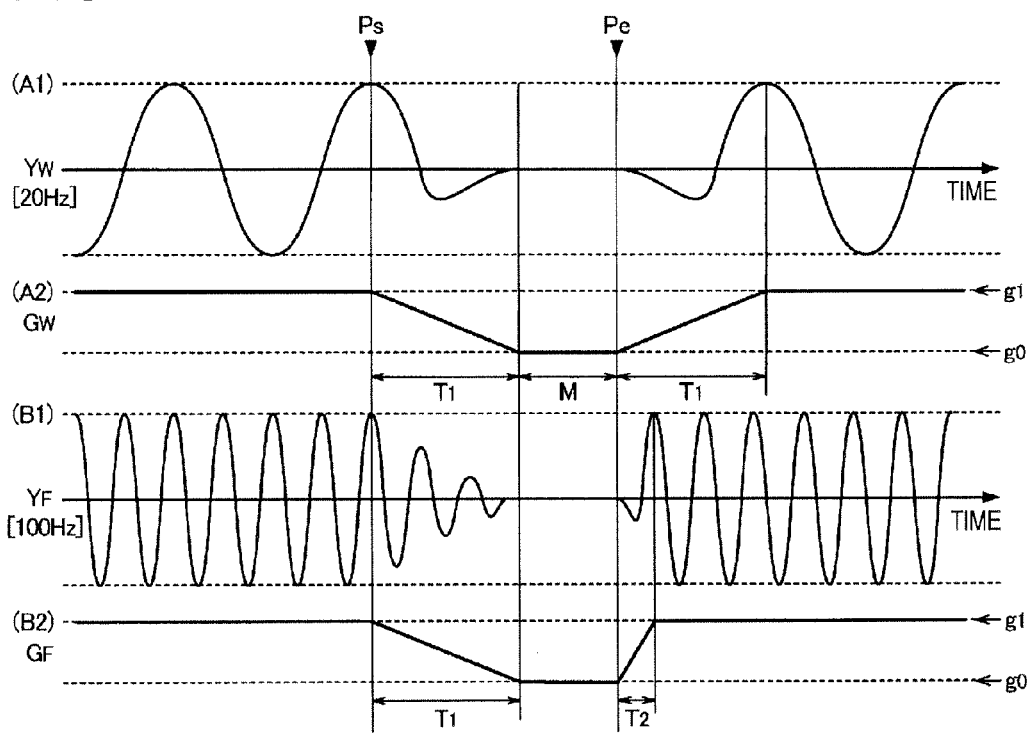
FIG. 4 is an explanatory view of a silence processing in a sound processing apparatus according to a fourth modification.

(4) Although in each embodiment described above, the time of both of the fade-out and fade-in of the sound signal YW is set to the first gradually-change time T1, and the time of both of the fade-out and fade-in of the sound signal YF is set to the second gradually-change time T2, the gradually-change time may differ between the sound signal YW and the sound signal YF for either fade-out or fade-in. For example, as shown in FIG. 4, the time of fade-out starting from the reference point Ps is set to the common first gradually-change time T1 for both of the sound signal YW and the sound signal YF, and similarly to each form described above, the time of fade-in starting from the reference point Pe differs between the sound signal YW (first gradually-change time T1) and the sound signal YF (second gradually-change time T2). The time of fade-out may differ between the sound signal YW and the sound signal YF, and the time of fade-in may be common between the sound signal YW and the sound signal YF.

Figure 5:
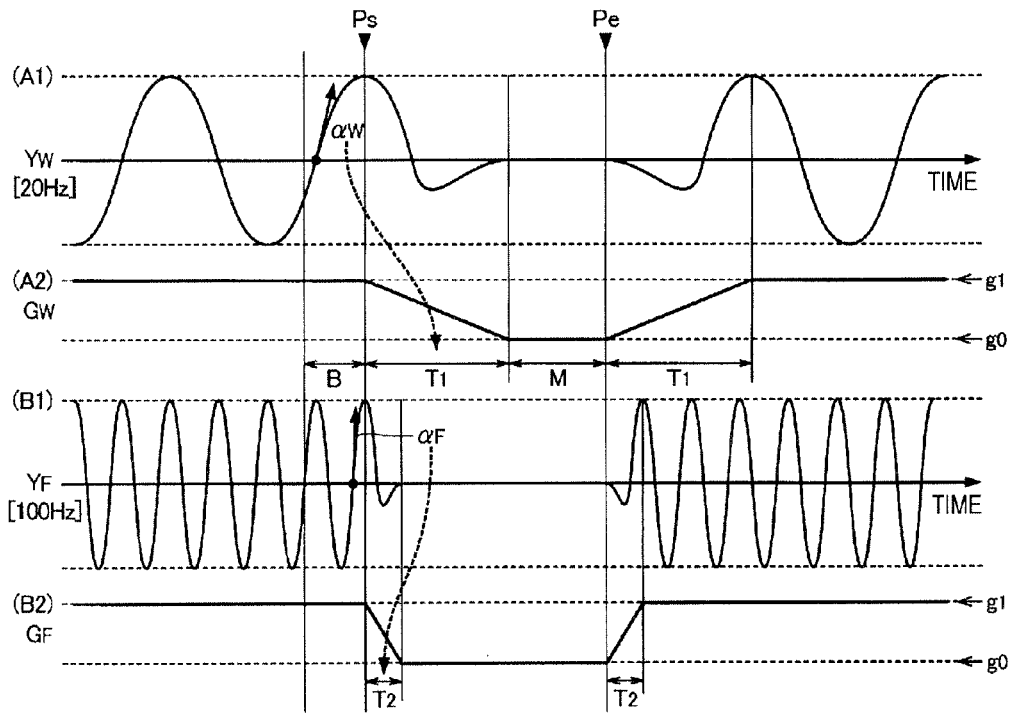
FIG. 5 is an explanatory view of silence processing in a sound processing apparatus according to a fifth modification.

(5) Although in each embodiment described above, the first gradually-change time T1 and the second gradually-change time T2 have the fixed values, the first gradually-change time T1 and the second gradually-change time T2 may be variably controlled. For example, a configuration in which the first gradually-change time T1 and the second gradually-change time T2 change depending on the characteristic of the sound signal YW or the sound signal YF is appropriately used. Specifically, as shown in FIG. 5, the control unit 50 calculates the slope (the amount of change in signal intensity within a unit time) αW at a given point of the waveform of the sound signal YW and the slope αF at a given point of the waveform of the sound signal YF within a buffer period B of a predetermined length with the reference point Ps as the end point, variably sets the first gradually-change time T1 in accordance with the slope αW, and variably sets the second gradually-change time T2 in accordance with the slope αF. For example, the control unit 50 sets the first gradually-change time T1 to a shorter time as the slope αW is large, and sets the second gradually-change time T2 to a shorter time as the slope αF is large. According to the above configuration, the first gradually-change time T1 and the second gradually-change time T2 can be set to an appropriate time length (enough time length) according to the characteristics of the sound signal YW and the sound signal YF.

The first gradually-change time T1 and the second gradually-change time T2 may be variably controlled in accordance with the size of the speakers 14. Specifically, the control unit 50 sets the gradually-change time of the adjustment value G corresponding to the speaker 14 of larger size to a longer time. Although a method in which the control unit 50 specifies the size of the speaker is arbitrary, for example, a method in which a user operates an input device (not shown) to designate the size of each speaker 14, or a method in which a known automatic sound field correction function of measuring and analyzing reproduced sound from each speaker 14 to correct the sound field is used to estimate the size of each speaker 14 is appropriately used.

Figure 8:
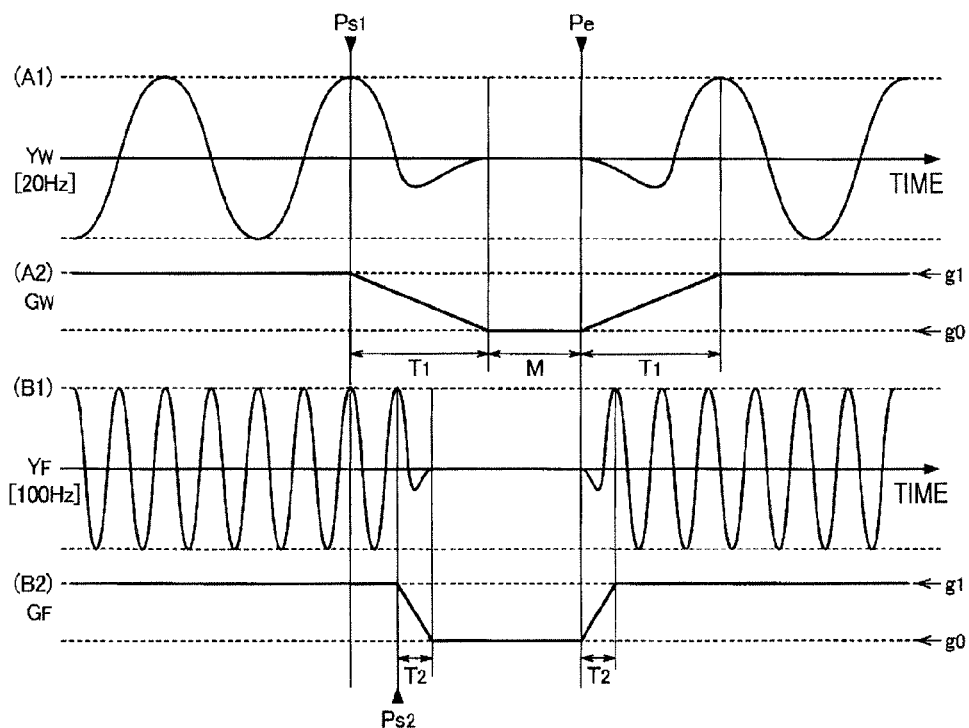
FIG. 8 is an explanatory view of silence processing in a sound processing apparatus according to a sixth modification.

(6) In the foregoing first embodiment, a case where the fade-out of the sound signal YW and the fade-out of the sound signal YF start from the common reference point Ps has been described. In the foregoing second embodiment, a case where the fade-out of the sound signal YW and the fade-out of the sound signal YF end at the common point of time Qe. Alternatively, the start or end of the fade-out of the sound signal YW and the fade-out of the sound signal YF may not be exactly aligned with the common reference point Ps or the common point of time Qe, and the second gradually-change time T2 of the sound signal YF may be included in the first gradually-change time T1 of the sound signal YW. For example, as shown in FIG. 8, the fade-out of the sound signal YW starts at a reference point Ps1, and the fade-out of the sound signal YF starts at a different reference point Ps2. In this case, as in the first embodiment or the second embodiment, the similar effects are obtained while maintaining the silence period M. The control signal C may be supplied at different timings for the sound signal YW and the sound signal YF, and the reference point Ps1 and the reference point Ps2 may be set. Alternatively, the control signal C may be supplied at the same timing for the sound signal YW and the sound signal YF, and only the sound signal YF may be delayed for a predetermined time and may start to be gradually changed. Although in FIG. 8, an example where this modification is applied to fade-out processing has been described, this modification may be applied to fade-in processing.

This application is based upon and claims the benefit of priority of Japanese Patent Application No. 2011-278375 filed on Dec. 20, 2011, the contents of which are incorporated herein by reference in its entirety.

What is claimed is:

1. A sound processing apparatus which processes a first sound signal and a second sound signal, the sound processing apparatus comprising:
 a first adjustor which adjusts a volume of the first sound signal;
 a second adjustor which adjusts a volume of the second sound signal; and
 a control unit which causes the first adjustor and the second adjustor to adjust the first sound signal gradually changed over a first gradually-change time period and the second sound signal gradually changed over a second gradually-change time period, wherein the second gradually-change time period is shorter than and included in the first gradually-change time period.

2. The sound processing apparatus according to claim 1, wherein
 the control unit controls the first adjustor and the second adjustor to cause gradually-change the first sound signal and gradually-change the second sound signal to start or end at a common point in time.

3. The sound processing apparatus according to claim 1, wherein
the first gradually-change time period is set to a time equal to or longer than the time of half wavelength of a waveform corresponding to a first frequency included in the first sound signal, and
the second gradually-change time period is set to a time equal to or longer than the time of half wavelength of a waveform corresponding to a second frequency included in the second sound signal.

4. The sound processing apparatus according to claim 1, wherein
the control unit has a capability of performing fade-out on the first sound signal and the second sound signal before a silence period starts and fade-in on the first sound signal and the second sound signal when the silence period elapses, and
the control unit causes the first adjustor and the second adjustor to adjust, for either or both of the fade-out or the fade-in, the first sound signal gradually changed over the first gradually-change time period and the second sound signal gradually changed over the second gradually-change time period.

5. The sound processing apparatus according to claim 1, wherein
the control unit controls the first gradually-change time period and the second gradually-change time period to be variable in accordance with characteristics of the first sound signal and the second sound signal.

6. The sound processing apparatus according to claim 5, wherein
the control unit sets the first gradually-change time period and the second gradually-change time period in accordance with slopes at given points of waveforms of the first sound signal and the second sound signal within a buffer period having a predetermined length before the first gradually-change time period and the second gradually-change time period.

7. A sound system comprising:
a first speaker in which a lower limit value of a reproduction band is set to be a first frequency;
a second speaker in which a lower limit value of a reproduction band is set to be a second frequency beyond the first frequency; and
a sound processing apparatus which generates a first sound signal to be supplied to the first speaker and a second sound signal to be supplied to the second speaker, wherein the sound processing apparatus includes
a first adjustor which adjusts a volume of the first sound signal,
a second adjustor which adjusts a volume of the second sound signal, and
a control unit which causes the first adjustor and the second adjustor to adjust the first sound signal gradually changed over a first gradually-change time period and the second sound signal gradually changed over a second gradually-change time period, wherein the second gradually-change time period is shorter than and included in the first gradually-change time period.

8. A sound processing method for processing a first sound signal and a second sound signal, the sound processing method comprising:
adjusting a volume of the first sound signal and a volume of the second sound signal to cause the first sound signal gradually changed over a first gradually-change time period and the second sound signal gradually changed over a second gradually-change time period, wherein the second gradually-change time period is shorter than and included in the first gradually-change time period.

9. The sound processing apparatus according to claim 1, wherein
the control unit controls the first adjustor and the second adjustor with the first gradually-change time period and the second gradually-change time period when the first sound signal and the second sound signal are faded out for a silent state or when the first sound signal and the second sound signal are faded in from the silent state.

10. The sound system according to claim 7, wherein
the control unit controls the first adjustor and the second adjustor with the first gradually-change time period and the second gradually-change time period when the first sound signal and the second sound signal are faded out for a silent state or when the first sound signal and the second sound signal are faded in from the silent state.

11. The sound processing method according to claim 8, wherein
adjusting the volume of the first sound signal and the volume of the second sound signal with the first gradually-change time period and the second gradually-change time period is performed when the first sound signal and the second sound signal are faded out for a silent state or when the first sound signal and the second sound signal are faded in from the silent state.

\* \* \* \* \*